United States Patent
Ogawa et al.

(10) Patent No.: US 7,417,884 B2
(45) Date of Patent: Aug. 26, 2008

(54) MEMORY SYSTEM

(75) Inventors: Toshio Ogawa, Kawasaki (JP);
Yoshihiro Takemae, Kasugai (JP);
Yoshinori Okajima, Kawasaki (JP);
Tetsuhiko Endo, Kawasaki (JP); Yasuro Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 265 days.

(21) Appl. No.: 11/443,030

(22) Filed: May 31, 2006

(65) Prior Publication Data
US 2007/0189052 A1     Aug. 16, 2007

(30) Foreign Application Priority Data
Feb. 16, 2006 (JP) .............................. 2006-039853

(51) Int. Cl.
*G11C 5/06* (2006.01)
*H04B 10/00* (2006.01)

(52) U.S. Cl. ............................ 365/64; 365/63; 398/135

(58) Field of Classification Search ................. 365/64
See application file for complete search history.

(56) References Cited

U.S. PATENT DOCUMENTS

| | | | |
|---|---|---|---|
| 7,106,611 B2 * | 9/2006 | Lee et al. ...................... | 365/63 |
| 7,200,024 B2 * | 4/2007 | Taylor ........................... | 365/64 |
| 2002/0178319 A1 * | 11/2002 | Sanchez-Olea ............. | 710/305 |
| 2003/0043426 A1 * | 3/2003 | Baker et al. .................. | 359/109 |
| 2007/0147846 A1 * | 6/2007 | Epitaux et al. .............. | 398/141 |
| 2007/0230231 A1 * | 10/2007 | Ogawa et al. ................. | 365/64 |

FOREIGN PATENT DOCUMENTS

JP     2005-064950 A     3/2005

* cited by examiner

*Primary Examiner*—Son L Mai
(74) *Attorney, Agent, or Firm*—Arent Fox LLP

(57) ABSTRACT

A memory controller multiplexes access signals each consisting of a plurality of bits as optical signals and outputs the multiplexed optical signals. At this time, the optical signals whose wavelengths differ depending on memory devices are generated. A memory interface unit demultiplexes the multiplexed optical signals into the original optical signals and converts the demultiplexed optical signals into electrical signals. The memory interface unit determines to which of the memory devices the electrical signals resulting from the conversion should be outputted, according to the wavelengths of the demultiplexed optical signals. This frees the memory controller from a need for transmitting to the memory interface unit a signal for identifying the memory device. The memory interface unit need not include a decoding circuit for identifying the memory device.

18 Claims, 16 Drawing Sheets

MEMORY SYSTEM

CROSS REFERENCE TO RELATED APPLICATION

This application is based upon and claims the benefit of priority from Japanese Patent Application No. 2006-039853, filed on Feb. 16, 2006, the entire contents of which are incorporated herein by reference.

BACKGROUND OF THE INVENTION

1. Field of the Invention

The present invention relates to a memory system including memory devices and a memory controller via which the memory devices are accessed.

2. Description of the Related Art

A microcontroller such as a CPU comes to have higher performance year by year. In accordance therewith, memory devices accessed by the microcontrollers and memory controllers need to have higher performance. Specifically, transfer rates (band widths) of data signals and so on between the microcontrollers and the memory devices have to be improved. In order to improve the transfer rate, in a certain kind of memory device, the number of bits in data signals is increased. Another memory device implements an interface circuit transferring serial data signals by using a high-frequency clock. Further, currently being considered are interface circuits transferring data signals each consisting of a plurality of bits, by using high-frequency clocks.

Interface circuits of conventional memory devices use electrical signals. The upper limit transfer rate of the electrical signals is said to be about 10 Gbps, and when it requires transfer rates higher than this, new interface circuits using optical signals and the like have to be considered.

For example, an art in which an optical interface is adopted between a microcontroller and a memory controller has been proposed (see, for example, Japanese Unexamined Patent Application Publication No. 2005-64950).

The Japanese Unexamined Patent Application Publication No. 2005-64950, however, does not describe details of the interface between the memory controller and memory devices. That is, it does not disclose the technology for improving transfer rates of signals transferred between the memory controllers and the memory devices.

SUMMARY OF THE INVENTION

It is an object of the present invention to improve the transfer rate of signals transferred between a memory controller and memory devices at the minimum cost.

In one embodiment of the present invention, a memory controller multiplexes access signals each consisting of a plurality of bits as an optical signal and outputs the multiplexed optical signal in order to access a plurality of memory devices. At this time, the memory controller generates optical signals whose wavelengths differ depending on the memory devices and multiplexes the generated optical signals. The multiplexing improves the transfer rate of the signals. A memory interface unit demultiplexes the multiplexed optical signal, which is received from the memory controller, into the original optical signals and converts the demultiplexed optical signals into electrical signals. At this time, the memory interface unit determines to which of the memory devices the electrical signals resulting from the conversion should be outputted, according to the wavelengths of the demultiplxed optical signals. This frees the memory controller from the need to transmit a signal, identifying the memory devices to be accessed, to the memory interface unit. The memory interface unit need not include a decoding circuit for identifying the memory devices to be accessed. Therefore, the transfer rate of signals transferred between the memory controller and the memory devices can be improved at minimum cost.

In a preferable example of the embodiment of the present invention, a first electrical/optical converter in the memory controller converts the access signals (electrical signals) into optical signals. A first optical multiplexer multiplexes the optical signals which result from the conversion by the first electrical/optical converter. A first optical demultiplexer in the memory interface unit demultiplexes the optical signal multiplexed by the first optical multiplexer into the original optical signals. A first optical/electrical converter converts the demultiplexed optical signals into the electrical signals. This can improve the transfer rate of signals transferred from the memory controller to the memory interface unit.

In a preferable example in the embodiment of the present invention, a second electrical/optical converter in the memory interface unit converts electrical signals outputted from the memory devices into optical signals with different wavelengths. A second optical multiplexer multiplexes the optical signals which result from the conversion by the second electrical/optical converter. A second optical demultiplexer in the memory controller demultiplexes the optical signal multiplexed by the second optical multiplexer into the original optical signals. A second optical/electrical converter converts demultiplexed optical signals into electrical signals. This can improve the transfer rate of signals transferred from the memory interface unit to the memory controller.

In a preferable example in the embodiment of the present invention, a first serializer in the memory controller converts parallel access signals into serial signals and outputs the serial signals resulting from the conversion to the first electrical/optical converter. A first deserializer in the memory interface unit has the first optical/electrical converter which converts the serial signals into parallel signals. This can reduce the number of the first electrical/optical converters and the first optical/electrical converters and reduce circuit scale of the first optical multiplexer and the first optical demultiplexer. That is, it is possible to reduce the cost for transferring signals from the memory controller to the memory interface unit.

In a preferable example in the embodiment of the present invention, second serializers in the memory interface unit converts parallel electrical signals outputted from memory devices into serial signals and outputs the serial signals to the second electrical/optical converter, respectively. A second deserializer in the memory controller converts the serial electrical signals, which result from conversion by a second optical/electrical converter, into parallel signals. This can reduce the number of the second electrical/optical converters and the second optical/electrical converters and reduce circuit scale of the second optical multiplexer and the second optical demultiplexer. That is, it is possible to reduce the cost for transferring signals from the memory interface unit to the memory controller.

In a preferable example in the embodiment of the present invention, a first timing adjustment circuit in the memory interface unit adjusts timings of the electrical signals which result from the conversion by the first optical/electrical converter. For example, the first timing adjustment circuit has a deskew circuit removing skew in electrical signals of a kind, or belonging to the same group, and a cycle adjustment circuit synchronizing cycles of the electrical signals from which the skew is removed by the deskew circuit. This enables correct signals to be transmitted/received without lowering the transfer rate even when signals deviate in phase due to optical transmission. Especially, even in an environment where the phase deviations of signals tend to occur, such as in a case where the memory controller and the memory devices are distant from each other, correct signals can be transmitted/ received without lowering the transfer rate.

In a preferable example in the embodiment of the present invention, a first wavelength converter in the memory controller converts the wavelengths of the access signals (optical signals) into wavelengths that differ depending on the memory device to be accessed. A first optical multiplexer multiplexes the optical signals converted by the first wavelength converter. A first optical demultiplexer in the memory interface unit demultiplexes the optical signal multiplexed by the first optical multiplexer into the original optical signals. A first optical/electrical converter converts the demultiplexed optical signals into electrical signals. This makes it possible to access a plurality of memory devices by optical cables even when the memory controller deals with optical signals. As a result, the transfer rate of signals can be improved with the minimum cost.

In a preferable example in the embodiment of the present invention, signals inputted/outputted to/from memory devices are multiplexed and then transferred, where the memory devices are of different kinds whose command systems differ from one another. This can improve the transfer rate of signals.

In a preferable example in the embodiment of the present invention, the memory controller outputs to at least one of the memory devices an access signal for a read operation and an access signal for a write operation, where the output is done independently from each other. At least one of the memory devices receives the access signal for the read operation and the access signal for the write operation independently from each other. As it is possible to execute the read operation and the write operation from/to the memory device independently, transfer rate of signals can be further improved.

In a preferable example in the embodiment of the present invention, at least one of the memory devices has a plurality of memory blocks capable of operating independently. The memory controller outputs, to the memory device having the memory blocks, independent access signals for each of the memory blocks. The memory device having the memory blocks receives the independent access signals for each of the memory blocks. Since each of the memory blocks can be independently accessed, the transfer rate of signals can be further improved.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
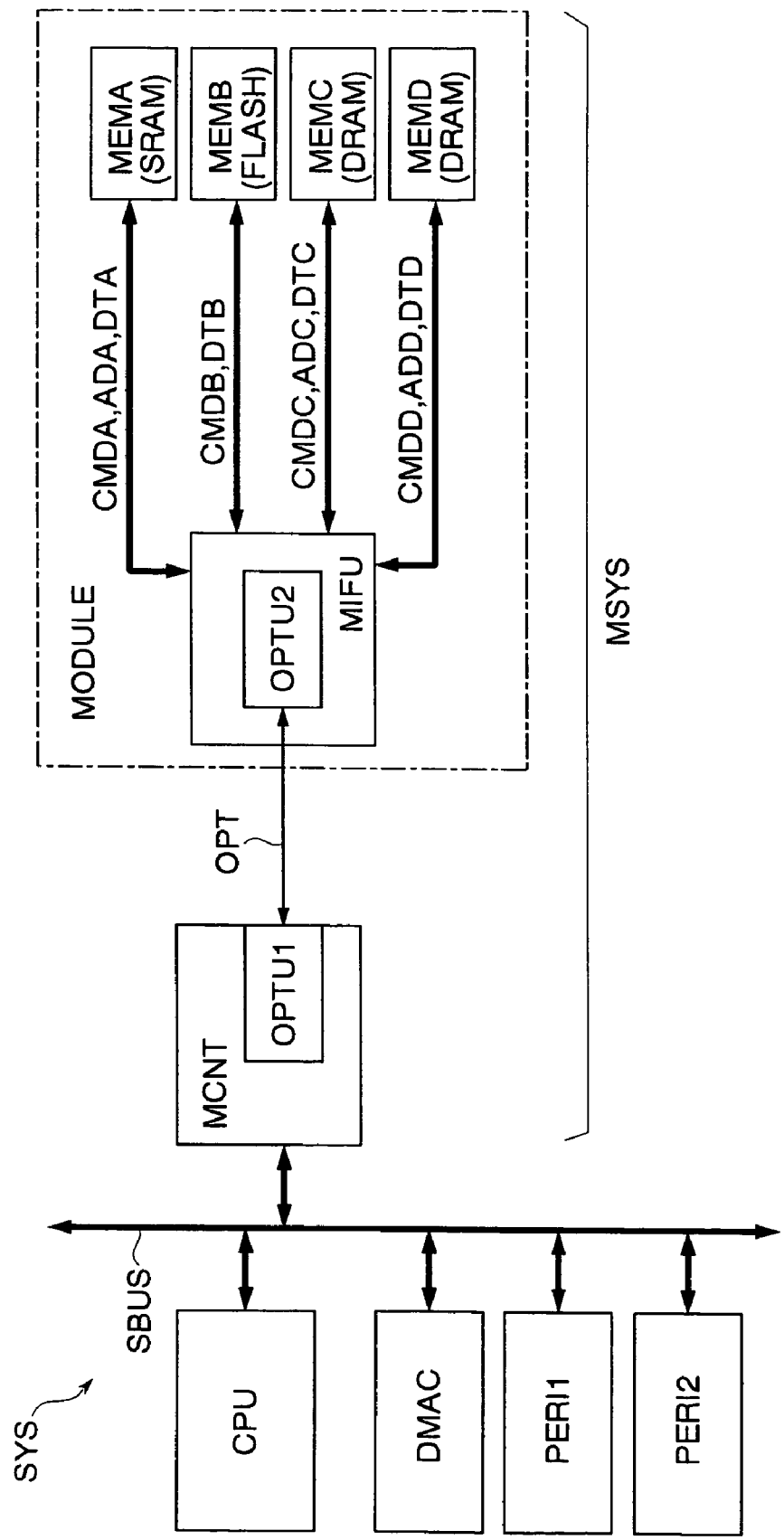
FIG. 1 is a block diagram showing the first embodiment.

Hereinafter, embodiments of the present invention will be described, using the drawings. In the drawings, each signal line shown with a heavy line is configured by a plurality of signal lines. Part of the blocks to which the heavy lines are connected is configured by a plurality of circuits. Further, each signal line through which a signal is transmitted is denoted by the same reference symbol as the name of the signal.

FIG. 1. shows a first embodiment of the present invention. In this embodiment, a memory system MSYS includes a memory controller MCNT and a memory module MODULE. The memory module MODULE is connected to the memory controller MCNT via one optical cable OPT. The memory controller MCNT as well as a CPU (microprocessor), a DMAC, and peripheral devices PERI1-2 is connected to a system bus SBUS. The system bus SBUS has an electrical interface.

The memory controller MCNT is formed of an optical converting unit OPTU1 and a not-shown optical connector which are mounted on a printed-wiring board or the like. The memory module MODULE is formed of a memory interface unit MIFU and memory devices MEM (MEMA, MEMB, MEMC, MEMD) which are mounted on a printed-wiring board or the like. The memory interface unit MIFU is formed of an optical converting unit OPTU2 and a not-shown optical connector which are mounted thereon. The memory devices MEMA, MEMB, MEMC, MEMD are a high-speed SRAM, a flash memory FLASH, a DRAM, and a DRAM respectively.

The memory devices MEM may be either of a clock synchronous type or of a clock asynchronous type. When the clock synchronous type memory devices MEM are mounted on the memory module MODULE, it is necessary to supply clock signals. In this case, the clock signals for the respective memory devices MEM may have different frequencies. The clock signals may be supplied via the optical cable OPT or may be supplied via another cable (an electrical cable or an optical cable).

In the present invention, the memory devices MEM are accessed by the CPU and the DMAC via the memory controller MCNT. Between the memory controller MCNT and the memory module MODULE, information is transferred by using optical signals. The optical transmission uses, for example, WDM (Wavelength Division Multiplex) method.

Examples of the WDM method applicable to the present invention are DWDM (Dense WDM), CWDM (Coarse WDM), and the like. Therefore, access signals each consisting of multiple bits for accessing the four memory devices MEM can be transferred through the single optical cable OPT. Here, the access signals include not only command signals for accessing the memory devices MEM but also data signals to be written to the memory devices MEM and data signals read from the memory devices MEM.

Access signals to the memory device MEMA (SRAM) include a command signal CMDA, an address signal ADA, and a data signal DTA. For example, the command signal CMDA is constituted of a chip select signal /CS, a write enable signal /WE, and an output enable signal /OE. Access signals to the memory device MEMB (FLASH) include a command signal CMDB and a data signal DTB. For example, the command signal CMDB is constituted of a command latch enable CLE, an address latch enable ALE, a chip enable signal /CE, and so on.

Access signals to the memory device MEMC (DRAM) include a command signal CMDC, an address signal ADC, and a data signal DTC. Similarly, access signals to the memory device MEMD (DRAM) include a command signal CMDD, an address signal ADD, and a data signal DTD. For example, each of the command signals CMDC, CMDD is constituted of a chip select signal /CS, a row address strobe signal /RAS, a column address strobe signal /CAS, and so on.

Figure 2:
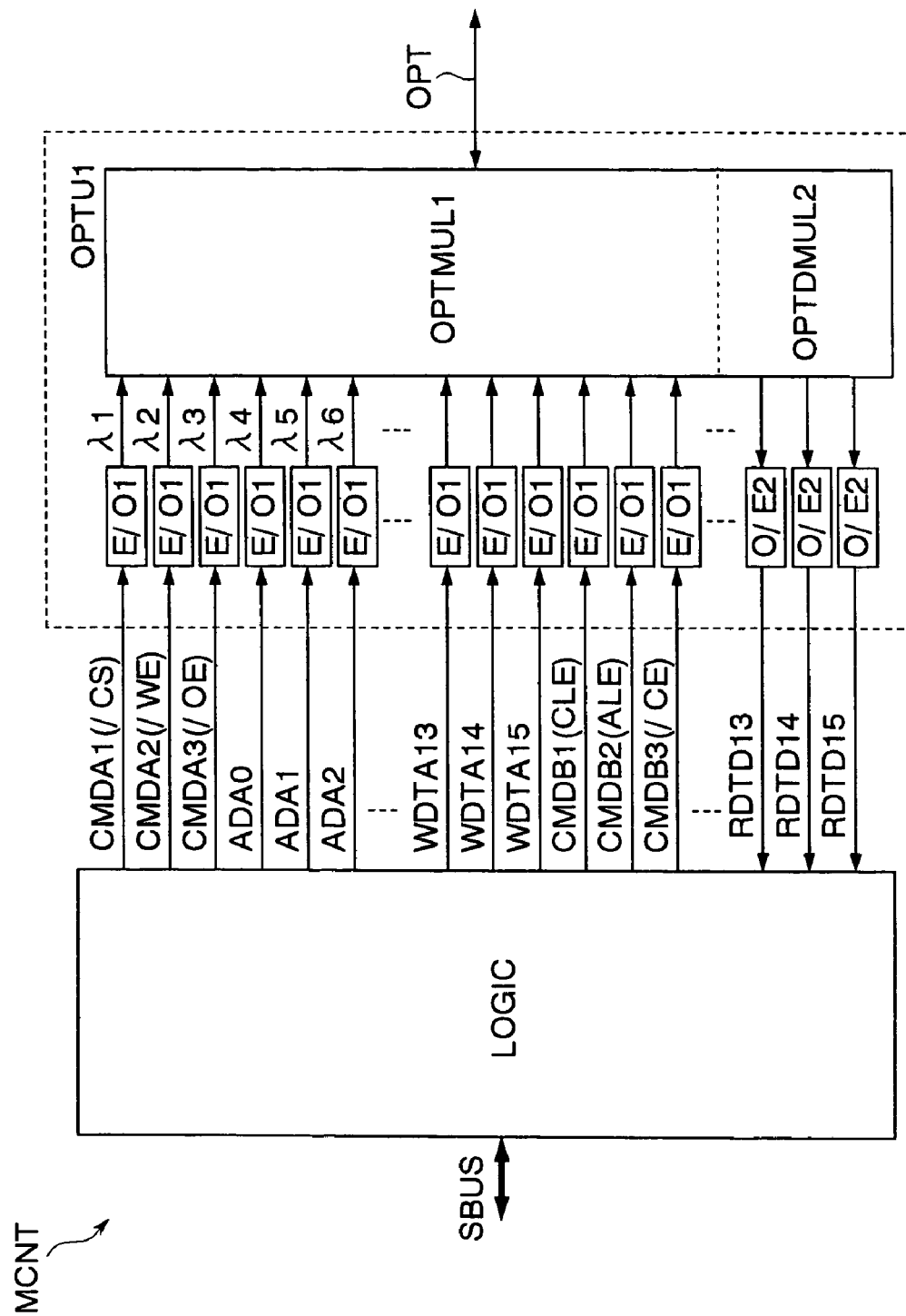
FIG. 2 is a block diagram showing details of a memory controller shown in FIG. 1.

FIG. 2 shows details of the memory controller MCNT shown in FIG. 1. The memory controller MCNT has a logic circuit LOGIC and an optical converting unit OPTU1. The logic circuit LOGIC is an electrical digital circuit. The logic circuit LOGIC outputs access signals (CMDA1-3, ADA0-2, and so forth), which are supplied via the system bus SBUS, to the optical converting unit OPTU1. Further, the logic circuit LOGIC outputs to the system bus SBUS read data RDT (RDTA, RDTB, RDTC, RDTD; FIG. 2 shows only RDTD13-15) which are received from the memory devices MEM (MEMA, MEMB, MEMC, MEMD) via the optical converting unit OPTU1.

For example, the command signal CMDA for accessing the memory device MEMA has 3 bits (CMDA1-3). The address signal ADA for accessing the memory device MEMA has 22 bits (ADA0-21). The data signal DTA to be written to the memory device MEMA has 16 bits. The data signals DTA are outputted/inputted from/to the logic circuit LOGIC as write data signals WDTA0-15 and read data signals RDTA0-15. Similarly, command signals, data signals, and so on each consisting of a plurality of bits are inputted/outputted to/from the other memory devices MEMB, MEMC, MEMD.

The optical converting unit OPTU1 has a plurality of first electrical/optical converters E/O1, a plurality of second optical/electrical converters O/E2, a first optical multiplexer OPTMUL1, and a second optical demultiplexer OPTDMUL2. The electrical/optical converters E/O1 are provided in correspondence to the respective bits of the access signals supplied from the logic circuit LOGIC. The electrical/optical converters E/O1 convert the respective bits of the access signals into optical signals with predetermined wavelengths λ (λ1-6 and so forth). Thus, the wavelengths λ of the optical signals outputted from the electrical/optical converters E/O1 are different depending on each memory device MEM to be accessed (read/write).

The optical multiplexer OPTMUL1 multiplexes the optical signals from the electrical/optical converters E/O1 and outputs the multiplexed optical signals to the optical cable OPT. The optical demultiplexer OPTDMUL2 demultiplexes multiplexed optical signals received via the optical cable OPT (the read data signals RDT) and outputs the demultiplexed optical signals to the optical/electrical converters O/E2. The optical/electrical converters O/E2 convert the optical signals from the optical demultiplexer OPTDMUL2 into electrical signals.

Figure 3:
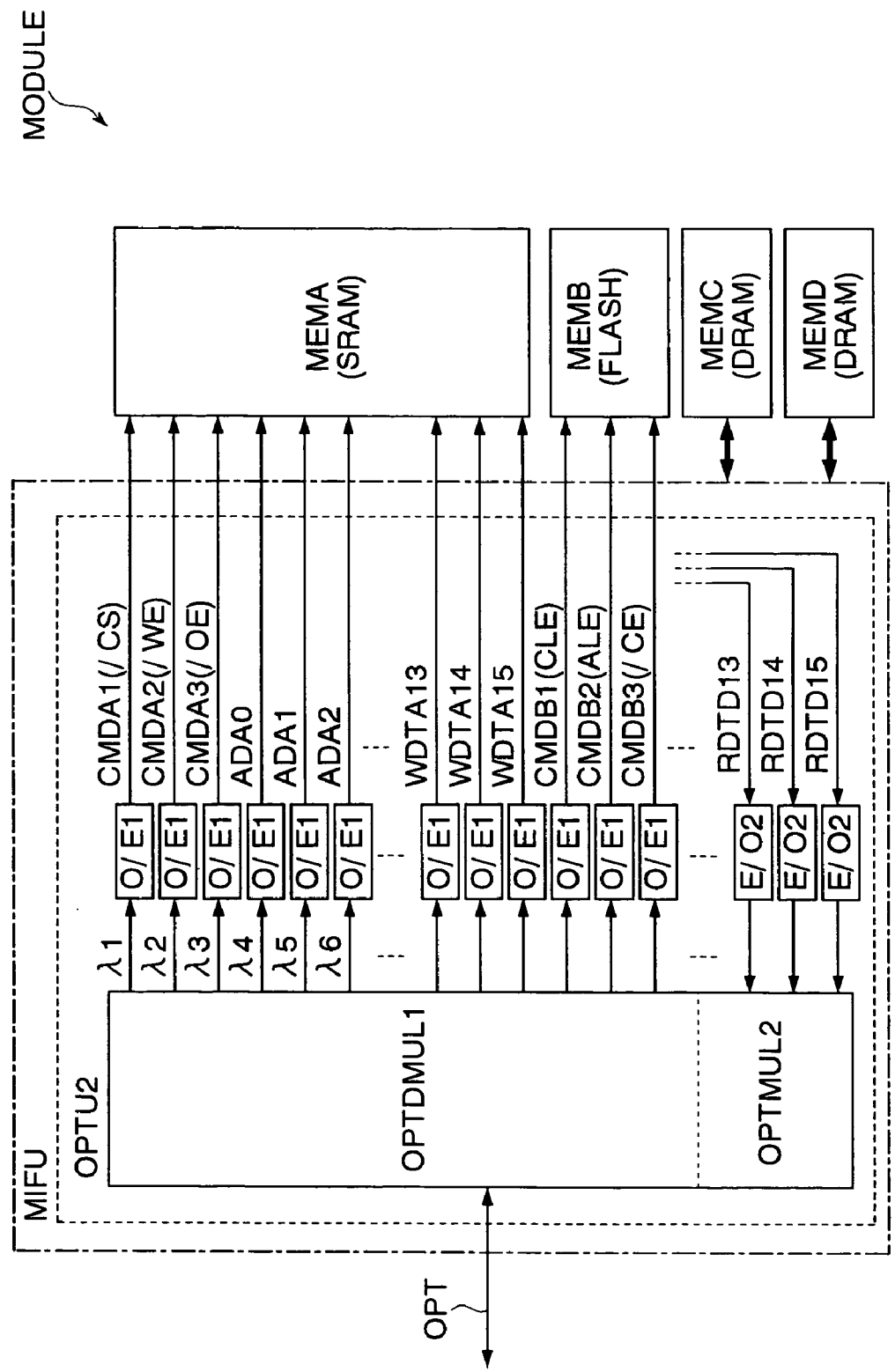
FIG. 3 is a block diagram showing details of a memory interface unit shown in FIG. 1.

FIG. 3 shows details of the memory interface unit MIFU shown in FIG. 1. The memory interface unit MIFU has a first optical demultiplexer OPTDMUL1, a second optical multiplexer OPTMUL2, a plurality of first optical/electrical converters O/E1, and a plurality of second electrical/optical converters E/O2.

The optical demultiplexer OPTDMUL1 demultiplexes the multiplexed optical signals (access signals) received via the optical cable OPT and outputs the demultiplexed optical signals to the optical/electrical converters O/E1. The optical/electrical converters O/E1 convert the optical signals demultiplexed by the optical demultiplexer OPTDMUL1 into electrical signals (access signals) to output the electrical signals to the corresponding memory devices MEM. That is, the optical demultiplexer OPTDMUL1 has a function of determining to which of the memory devices MEM the received optical signals should be outputted, according to the wavelengths λ of the optical signals.

The electrical/optical converters E/O2 convert the data signals RDT read from the memory devices MEM into optical signals with different wavelengths. The optical multiplexer OPTMUL2 multiplexes the optical signals from the electrical/optical converters E/O2 and outputs the multiplexed optical signals to the optical cable OPT.

When seen from the memory controller MCNT, the memory interface unit MIFU is logically transparent (transparency). That is, the access by the memory controller MCNT via the memory interface unit MIFU is equivalent to direct access to the memory devices MEM.

In the foregoing first embodiment, the memory controller MCNT need not transmit to the memory interface unit MIFU a signal for identifying the memory device MEM to be accessed. The memory interface unit MIFU need not include a decoding circuit or the like for identifying the memory device MEM to be accessed. Therefore, it is possible to improve the transfer rate of signals transferred between the memory controller MCNT and the memory devices MEM with the minimum cost.

Figure 4:
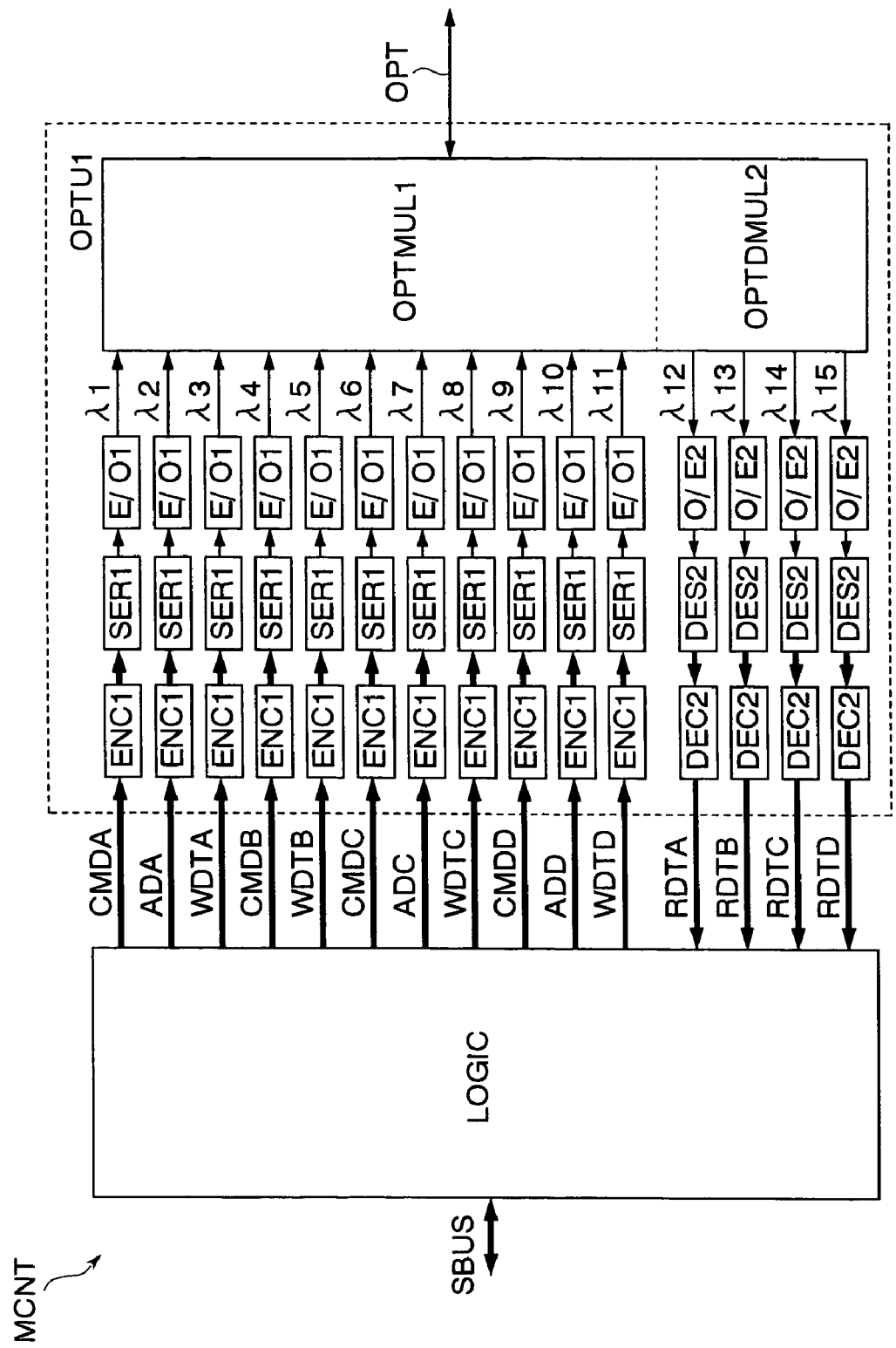
FIG. 4 is a block diagram showing details of a memory controller in the second embodiment.
Figure 5:
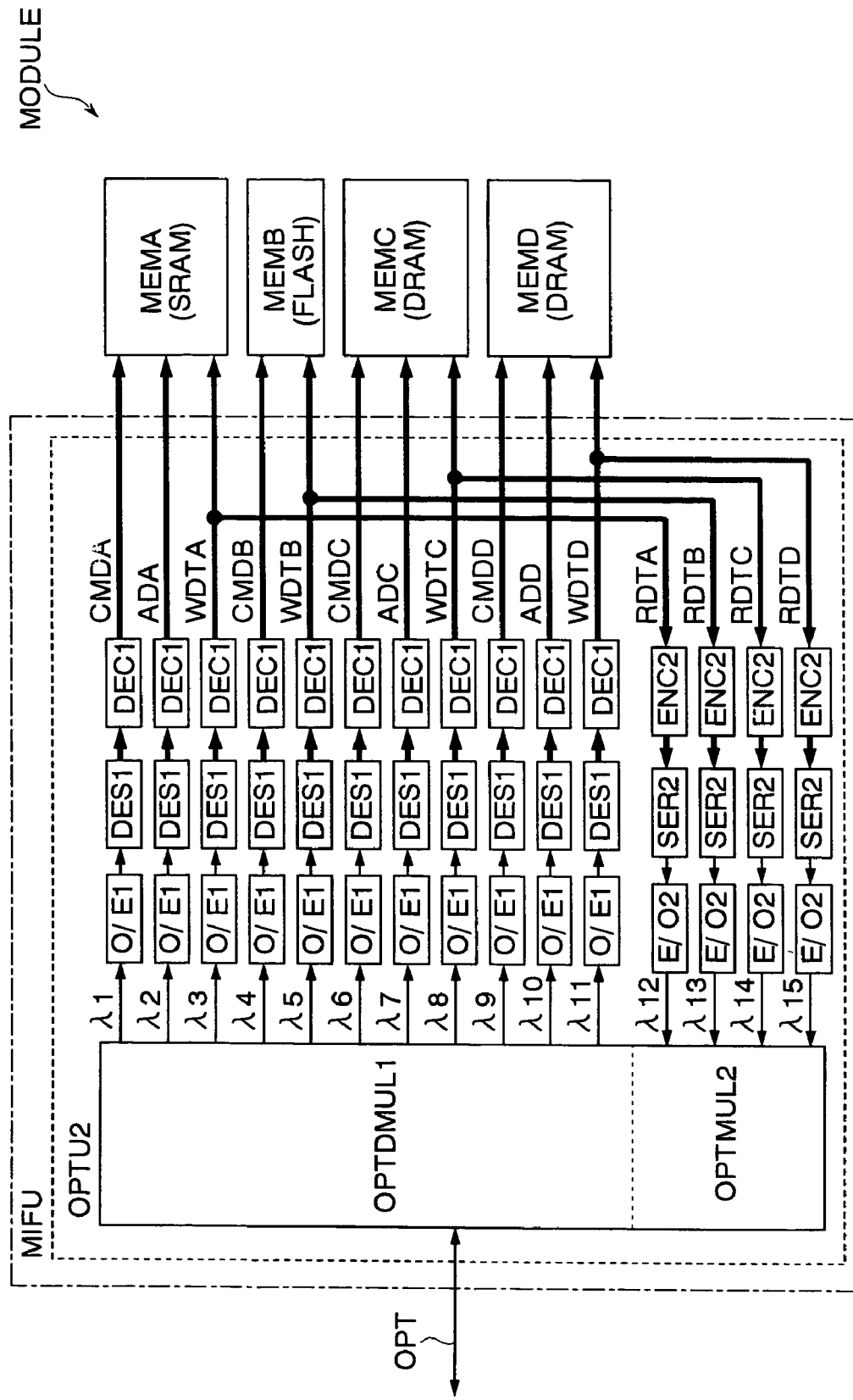
FIG. 5 is a block diagram showing details of a memory interface unit in the second embodiment.

FIG. 4 and FIG. 5 show details of a memory controller MCNT and a memory interface unit MIFU in a second embodiment of the present invention. The same reference symbols are used to designate the same components as the components described in the first embodiment, and detailed description thereof will be omitted. As shown in FIG. 4, the memory controller MCNT has first encoders ENC1 and first serializers SER1 connected in series to inputs of first electrical/optical converters E/O1, and second deserializers DES2 and second decoders DEC2 connected in series to outputs of second optical/electrical converters O/E2.

As shown in FIG. 5, the memory interface unit MIFU has first deserializers DES1 and first decoders DEC1 connected in series to outputs of first optical/electrical converters O/E1, and second encoders ENC2 and second serializers SER2 connected in series to inputs of second electrical/optical converters E/O2. That is, in this embodiment, electrical signals are parallel/serial converted by the serializers SER1, SER2 before converted into optical signals. The optical signals are converted into electrical signals, which are then serial/parallel converted by the deserializers DES1-2. The other configuration is the same as that of the first embodiment.

In FIG. 4, the encoders ENC1 are, for example, 8B10B encoders. The serializers SER1 convert parallel access signals coded by the encoders ENC1 into serial signals. The electrical/optical converters E/O1 convert the serial signals resulting from the conversion into optical signals with predetermined wavelengths λ.

The wavelengths λ1-15 of the optical signals outputted from the electrical/optical converters E/O1 and an optical demultiplexer OPTDMUL2 are different depending on each memory device MEM to be accessed (read/write). Specifically, the wavelengths λ1, λ2, λ3, λ12 are used for accessing the memory device MEMA. The wavelengths λ4, λ5, λ13 are used for accessing the memory device MEMB. The wavelengths λ6, λ7, λ8, λ14 are used for accessing the memory device MEMC. The wavelengths λ9, λ10, λ11, λ15 are used for accessing the memory device MEMD.

An optical multiplexer OPTML1 multiplexes the optical signals (λ1-11) received from the electrical/optical converters E/O1 and outputs the multiplexed optical signals to an optical cable OPT. The optical demultiplexer OPTDMUL2 demultiplexes multiplexed optical signals (read data signals RDT) received via the optical cable OPT and outputs the demultiplexed optical signals (λ12-15) to the optical/electrical converters O/E2. The optical/electrical converters O/E2 convert the optical signals received from the optical demultiplexer OPTDMUL2 into electrical signals (serial signals). The deserializers DES2 convert the serial signals converted by the optical/electrical converters O/E2, into parallel signals. The decoders DEC2 are, for example, 10B8B decoders.

In FIG. 5, an optical demultiplexer OPTDMUL1 demultiplexes the multiplexed optical signals (access signals) received via the optical cable OPT and outputs the demultiplexed optical signals (λ1-11) to the optical/electrical converters O/E1. The optical signals λ1-3 demultiplexed by the optical demultiplexer OPTDMUL1 are access signals to the memory device MEMA. Similarly, the optical signals λ4-5, λ6-8, λ9-11 are access signals to the memory devices MEMB, MEMC, MEMD respectively. That is, the optical demultiplexer OPDMUL1 has a function of determining to which of the memory devices MEM the received optical signals should be outputted, according to the wavelengths of the optical signals.

Functions of the optical/electrical converters O/E1, the deserializers DES1, the decoders DEC1, the encoders ENC2, the serializers SER2, and the electrical/optical converters E/O2 are the same as the functions of the optical/electrical converters O/E2, the deserializers DES2, the decoders DEC2, the encoders ENC1, the serializers SER1, and the electrical/optical converters E/O1 in FIG. 4 described above. An optical multiplexer OPTMUL2 multiplexes the optical signals (λ12-15) from the electrical/optical converters E/O2 and outputs the multiplexed optical signals to the optical cable OPT.

The foregoing second embodiment can also provide the same effects as those of the first embodiment described above. In addition, in this embodiment, the electrical signals converted to the serial signals by the serializers SER1-2 are converted into the optical signals, which are then transferred, so that the number of wavelengths used in the optical transmission can be reduced. This can reduce the number of the electrical/optical converters E/O1-2 and the optical/electrical converters O/E1-2. Further, the configuration of the optical multiplexers OPTMUL1-2 and the optical demultiplexers OPTDMUL1-2 can be simplified. As a result, a memory system having a high transfer rate can be configured at low cost.

Figure 6:
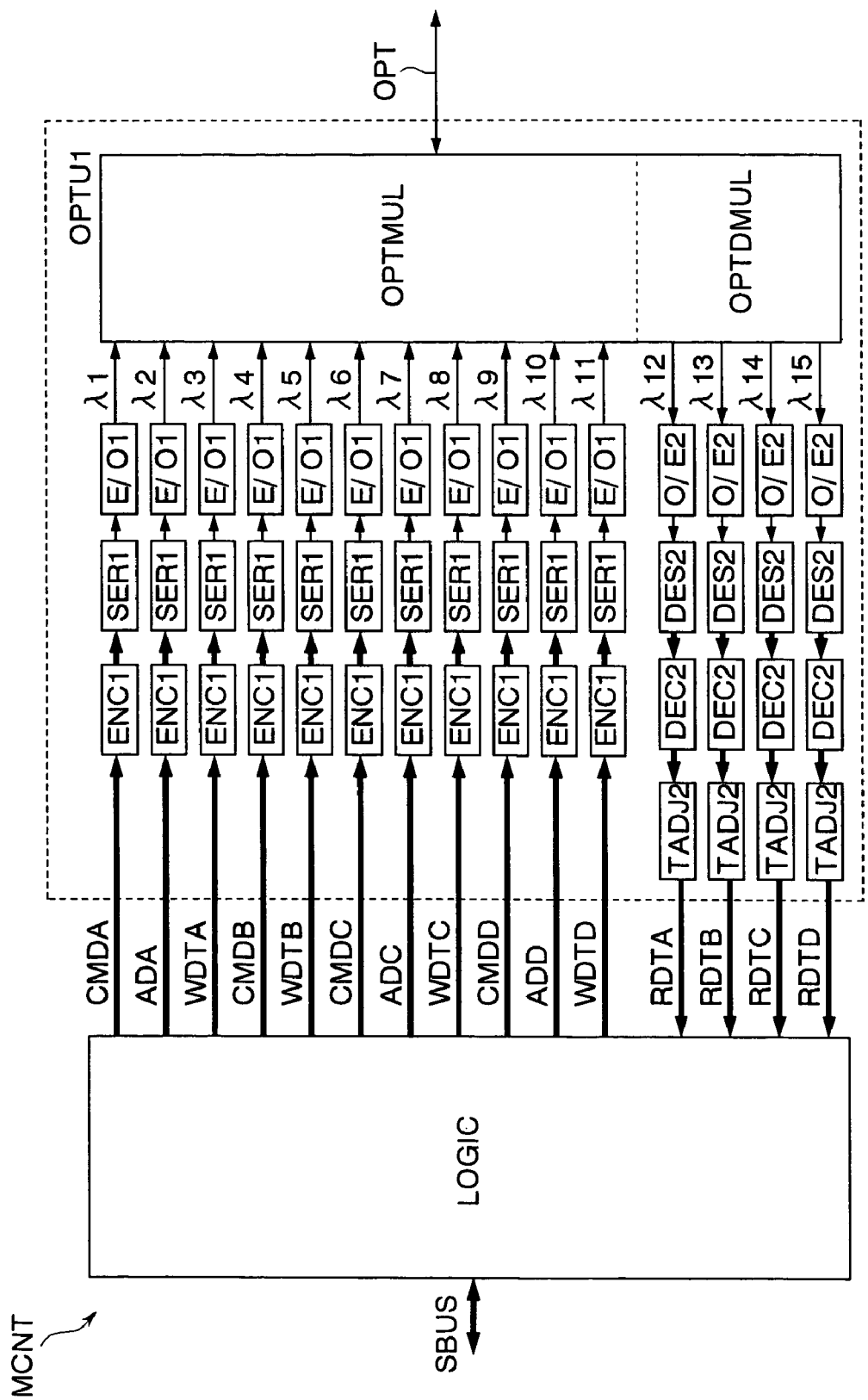
FIG. 6 is a block diagram showing details of a memory controller in the third embodiment.
Figure 7:
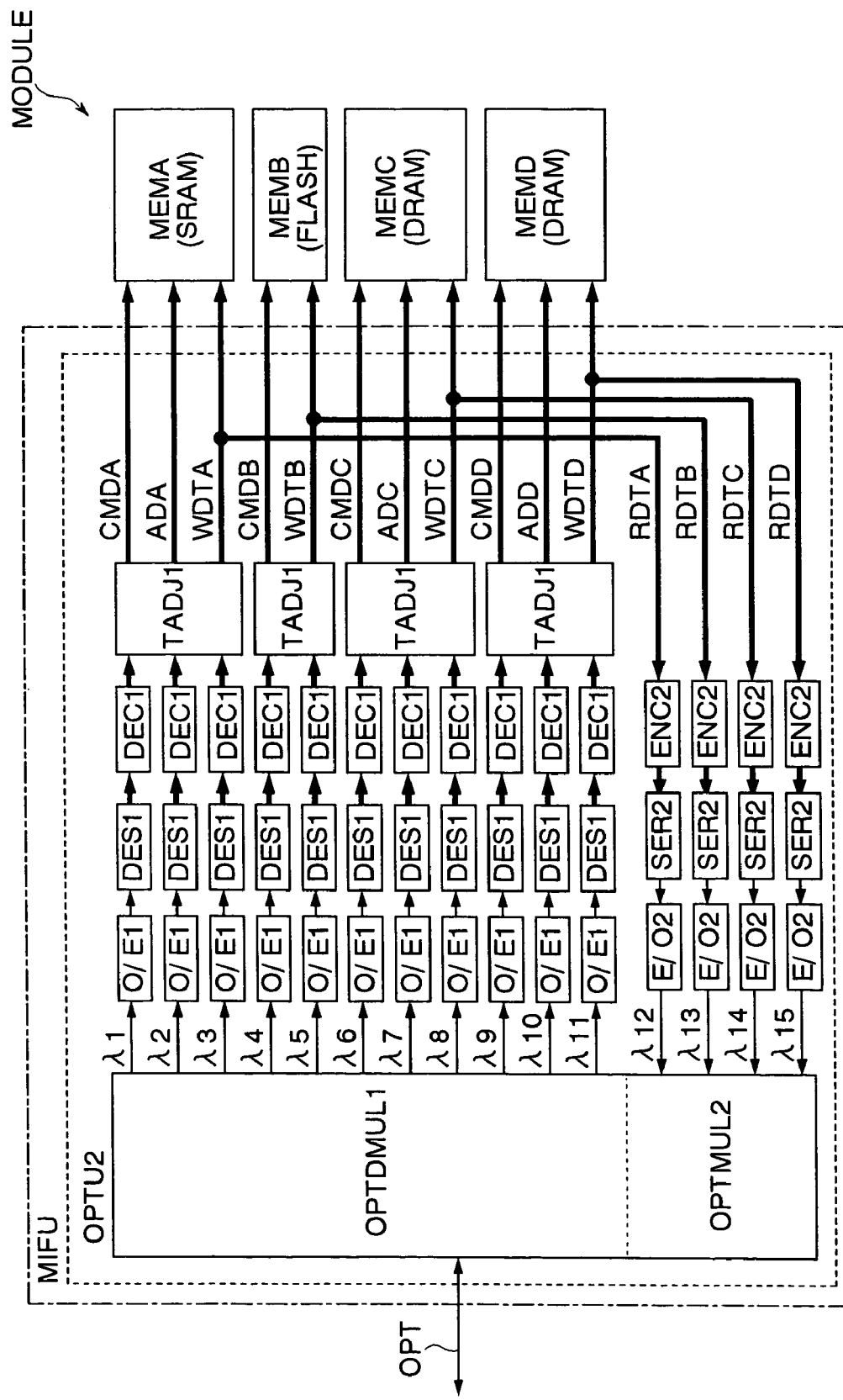
FIG. 7 is a block diagram showing details of a memory interface unit in the third embodiment.

FIG. 6 and FIG. 7 show details of a memory controller MCNT and a memory interface unit MIFU in a third embodiment of the present invention. The same reference symbols are used to designate the same components as the components described in the first and second embodiments, and detailed description thereof will be omitted. In this embodiment, as shown in FIG. 7, first timing adjustment circuits TADJ1 are connected to outputs of decoders DEC1 of the memory interface unit MIFU. As shown in FIG. 6, second timing adjustment circuits TADJ2 are connected to outputs of decoders DEC2 of the memory controller MCNT. The other configuration is the same as that of the second embodiment. The timing adjustment circuits TADJ1-2 are formed for each memory device MEM.

Figure 8:
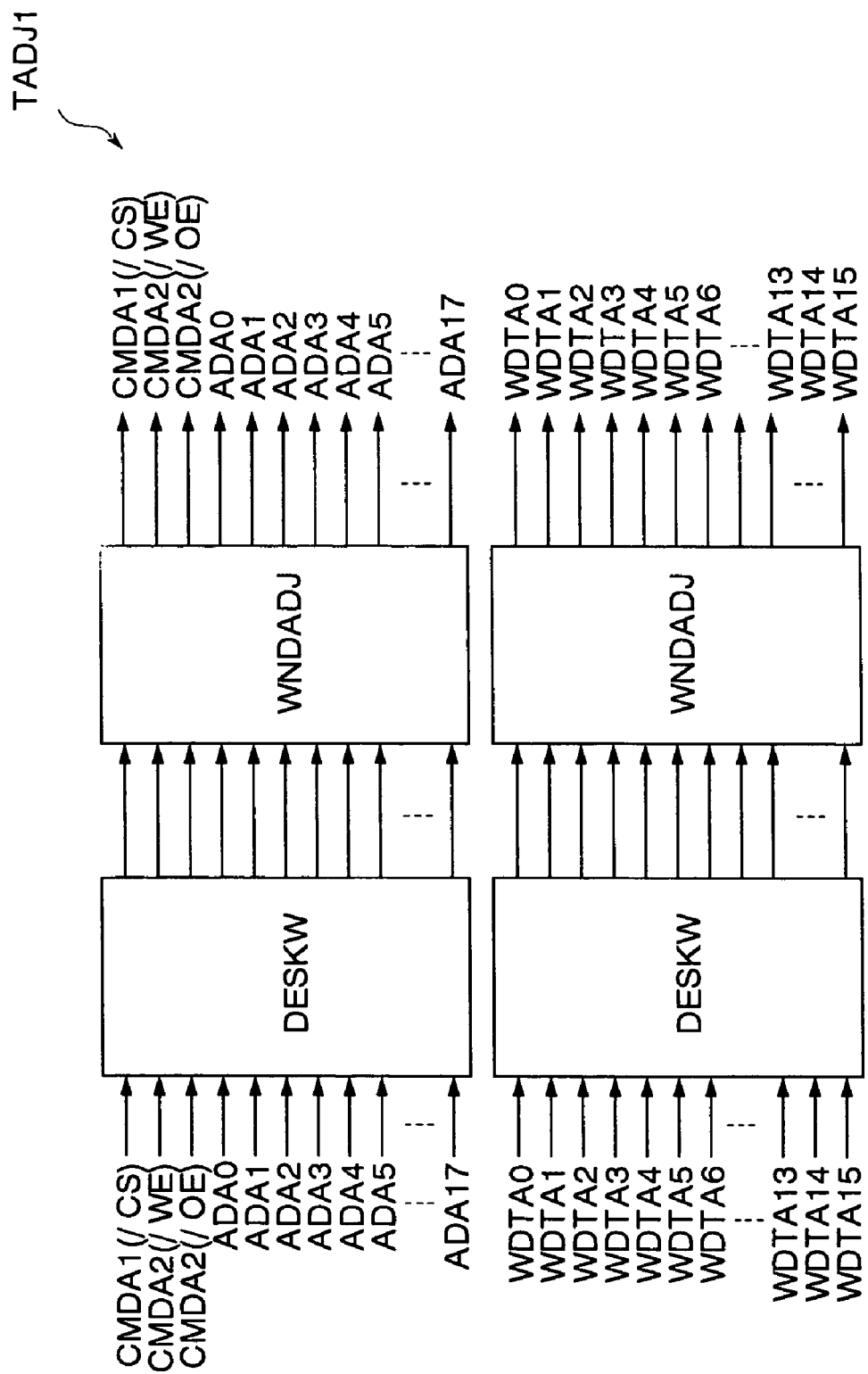
FIG. 8 is a block diagram showing details of a timing adjustment circuit corresponding to a memory device shown in FIG. 7.

FIG. 8 shows details of the timing adjustment circuit TADJ1 corresponding to a memory device MEMA shown in FIG. 7. The timing adjustment circuit TADJ1 has two deskew circuits DESKW and two window adjusting circuits WNDADJ.

One of the deskew circuits DESKW receives command signals CMDA (CMDA1-3) and address signals ADA (ADA0-17) and removes skew in these signals (edge deviation of the signals). The other deskew circuit DESKW receives write data signals WDTA (WDTA0-15) and removes skew in these signals. One of the window adjusting circuits WNDADJ receives the command signals CMDA and the address signals from which the skew has been removed, and corrects cycle deviation in these signals. The other window adjusting circuit WNDADJ receives the write data signals WDTA from which the skew has been removed and corrects cycle deviation in these signals.

Similarly to the timing adjustment circuit TADJ1, each of the timing adjustment circuits TADJ2 (FIG. 6) receiving read data signals RDT (RDTA, RDTB, RDTC, RDTD) has deskew circuits DESKW and window adjusting circuits WNDADJ, though not shown. The timing adjustment circuits TADJ2 remove skew in the read data signals RDT to adjust cycle deviation thereof.

The timing adjustment circuits TADJ1-2 corresponding to the memory devices MEMB, MEMC, MEMD also have substantially the same structure as that in FIG. 8. That is, the timing adjustment circuits TADJ1-2 have the deskew circuits DESKW and the window adjusting circuits WNDADJ which correspond to command signals CMD, address signals AD, and write data signals WDT, and have the deskew circuits DESKW and the window adjusting circuits WNDADJ which correspond to read data signals RDT.

Even if phases of the signals greatly deviate due to the electrical/optical conversion, optical transmission, and optical/electrical conversion, the memory controller MCNT is capable of supplying correct signals to the memory devices MEM and receiving correct data signals from the memory devices MEM, owing to the timing adjustment circuits TADJ1-2.

The foregoing third embodiment can also provide the same effects as those of the first and second embodiments described above. In addition, in this embodiment, it is possible to transmit/receive correct signals without lowering the transfer rate even when the phases of the signals deviate due to the optical transmission. In particular, in an environment where the phase deviation of signals tend to occur, such as in a case where the memory controller MCNT and the memory system MSYS (memory devices MEM) are distant from each other, it is also possible to transmit/receive correct signals without lowering the transfer rate.

Figure 9:
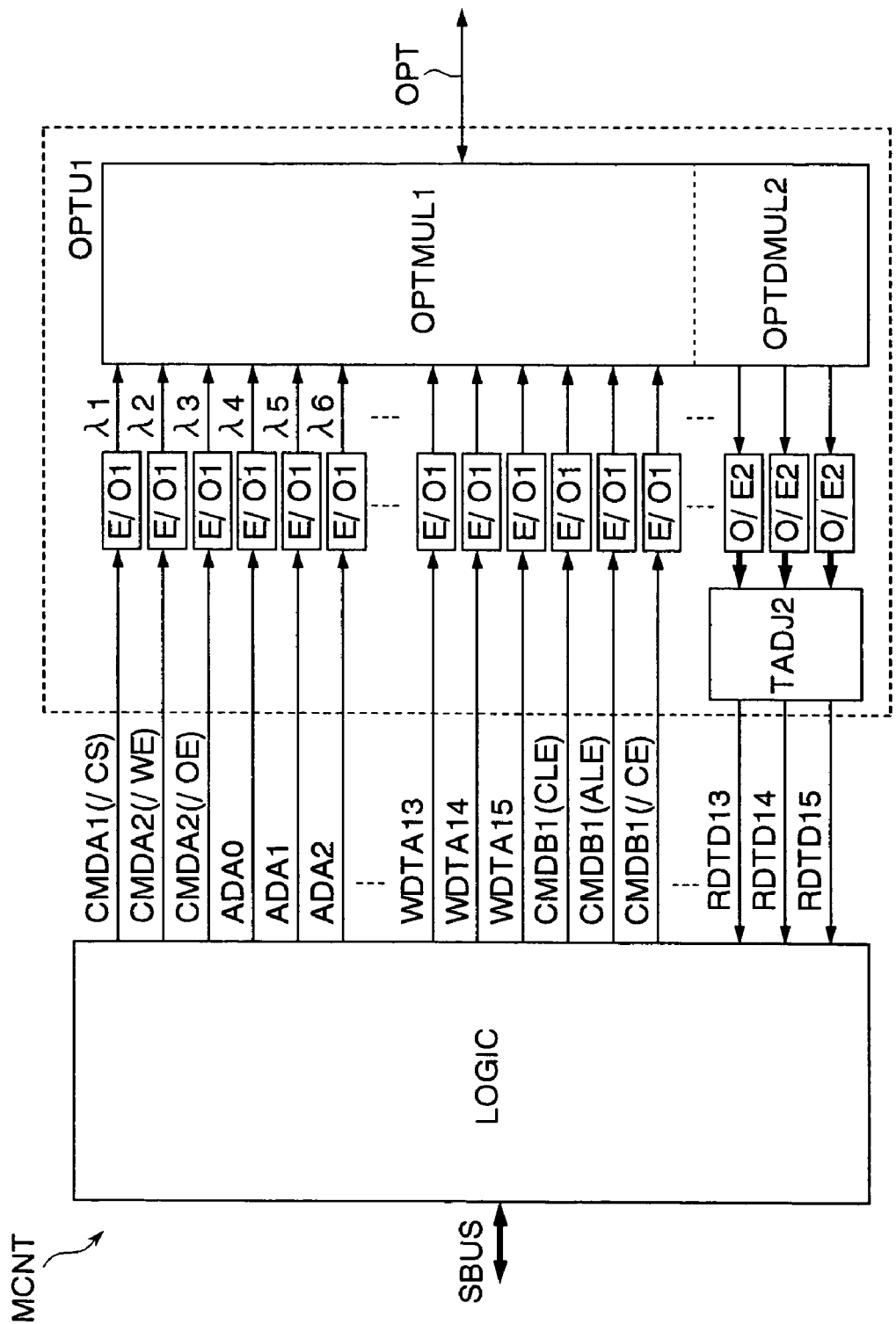
FIG. 9 is a block diagram showing details of a memory controller in a fourth embodiment.
Figure 10:
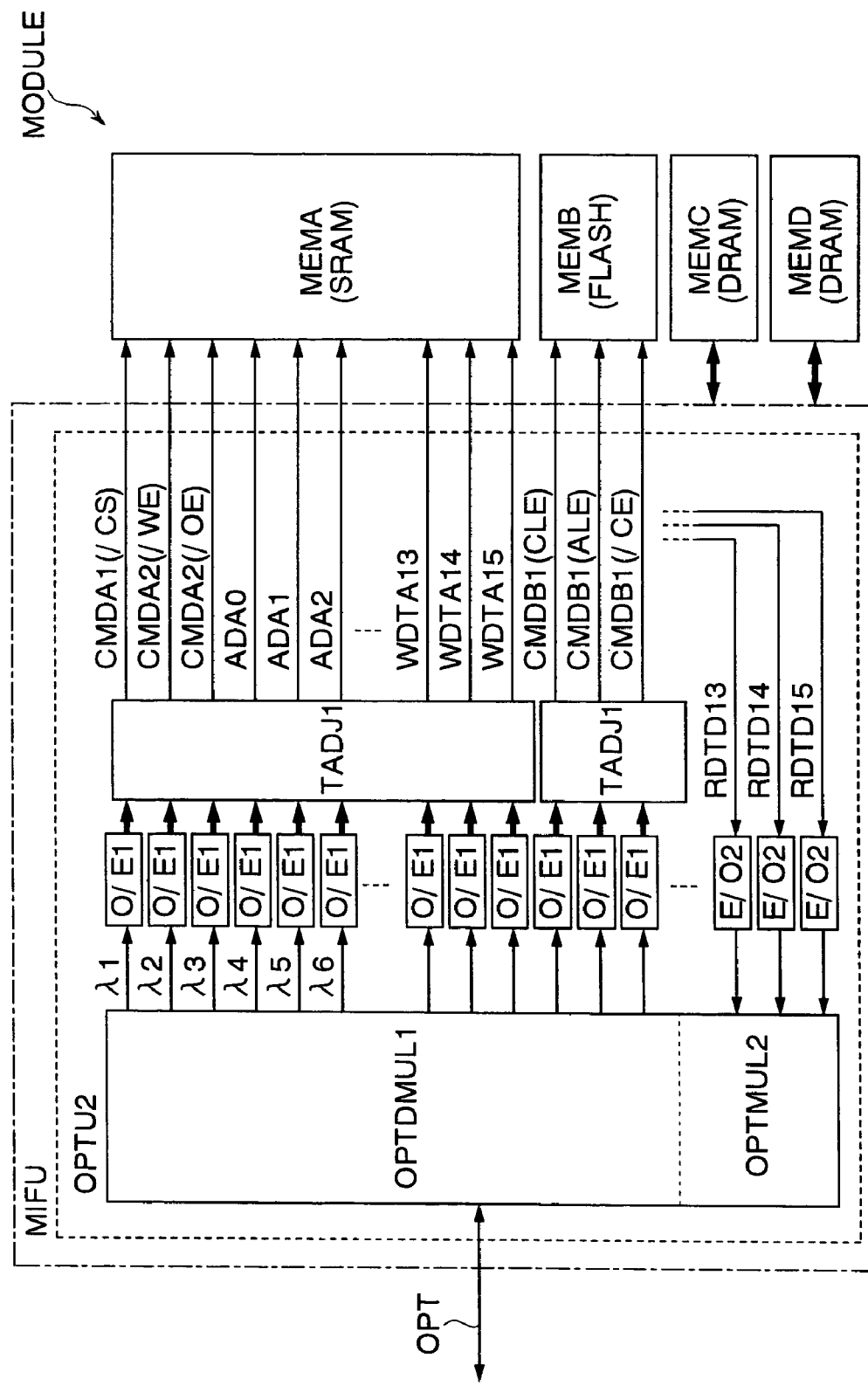
FIG. 10 is a block diagram showing details of a memory interface unit in the fourth embodiment.

FIG. 9 and FIG. 10 show details of a memory controller MCNT and a memory interface unit MIFU in a fourth embodiment of the present invention. The same reference symbols are used to designate the same components as the components described in the first and third embodiments, and detailed description thereof will be omitted.

A memory system of this embodiment is configured such that timing adjustment circuits TADJ2, TADJ1 are formed in the memory controller MCNT and the memory interface unit MIFU of the first embodiment respectively. The other configuration is the same as that of the first embodiment. The fourth embodiment can also provide the same effects as those of the first and third embodiments described above.

Figure 11:
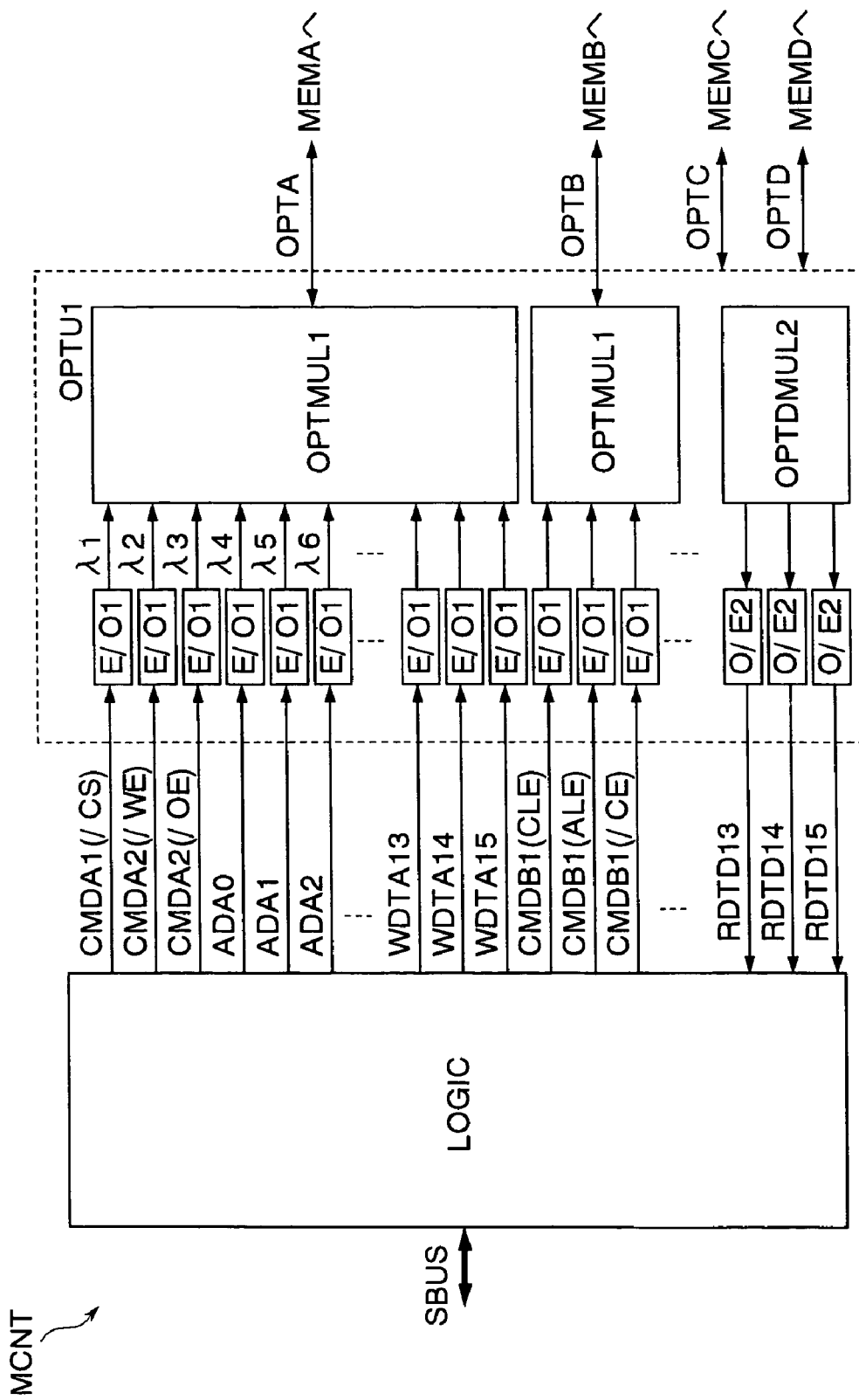
FIG. 11 is a block diagram showing details of a memory controller in the fifth embodiment.
Figure 12:
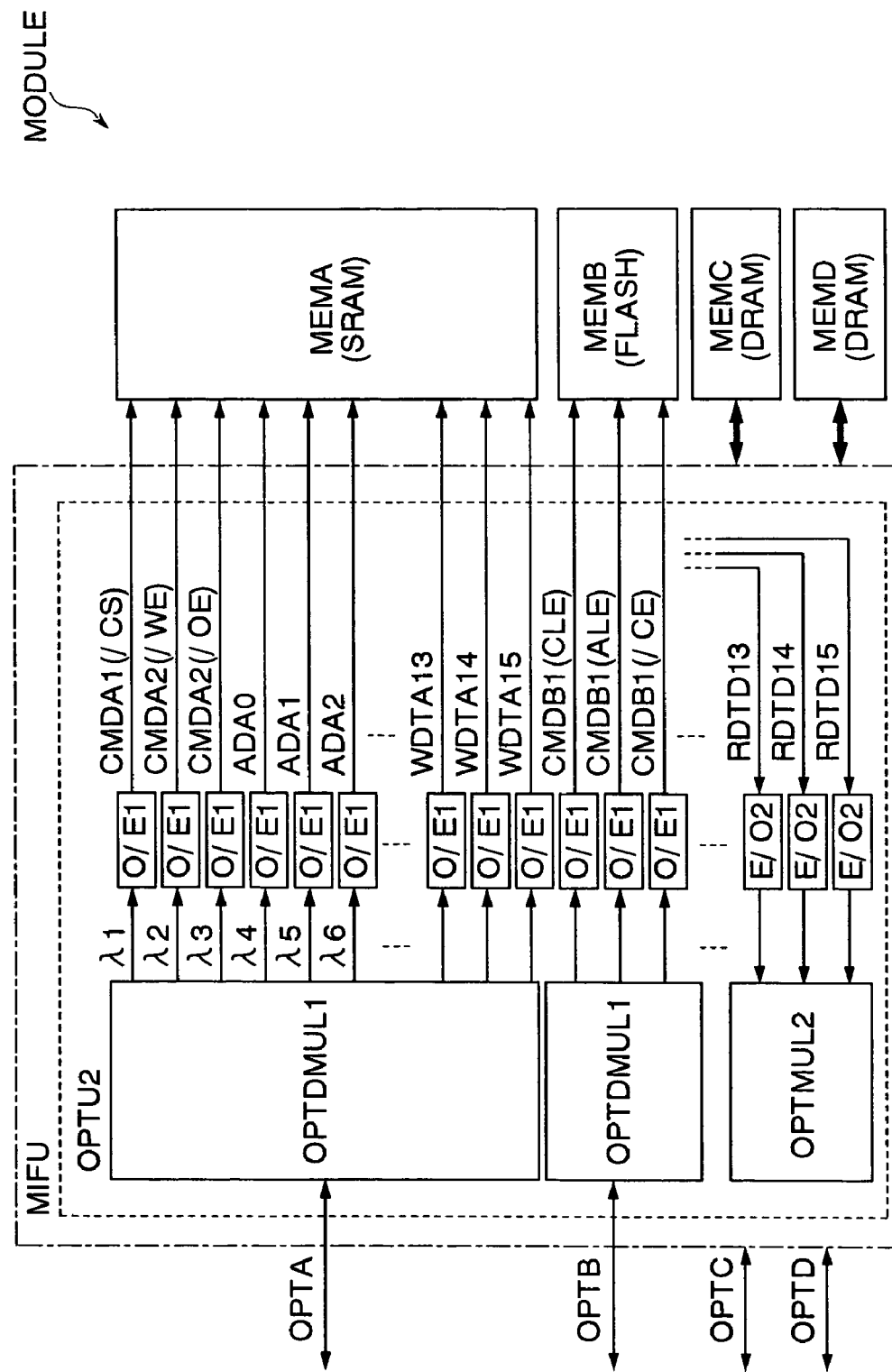
FIG. 12 is a block diagram showing details of a memory interface unit in the fifth embodiment.

FIG. 11 and FIG. 12 show details of a memory controller MCNT and a memory interface unit MIFU in a fifth embodiment of the present invention. The same reference symbols are used to designate the same components as the components described in the first embodiment, and detailed description thereof will be omitted.

In this embodiment, optical multiplexers OPTMUL1-2 and optical demultiplexers OPTDMUL1-2 are formed for each of memory devices MEMA, MEMB, MEMC, MEMD. Further, optical cables OPTA, OPTB, OPTC, OPTD are laid for the respective memory devices MEMA, MEMB, MEMC, MEMD. The other configuration is the same as that of the first embodiment.

Wavelengths λ of optical signals multiplexed by the optical multiplexers OPTMUL1-2 may differ for each of the electrical/optical converters O/E1-2. In this case, the same electrical/optical converters O/E1-2 as those of the first embodiment are usable. Alternatively, the wavelengths λ of the optical signals may differ for each the optical cables OPTA, OPTB, OPTC, OPTD. In this case, the optical multiplexers OPTMUL1-2, the optical demultiplexers OPTDMUL1-2, and the electrical/optical converters O/E1-2 arranged for each of the memory devices MEM can be made common.

The foregoing fifth embodiment can also provide the same effects as those of the first embodiment described above. In addition, in this embodiment, the major circuits and the optical cable OPT are independently structured for each of the memory devices MEM, which can facilitate design change of the memory controller MCNT and the memory interface unit MIFU according to the memory device MEM to be connected.

Figure 13:
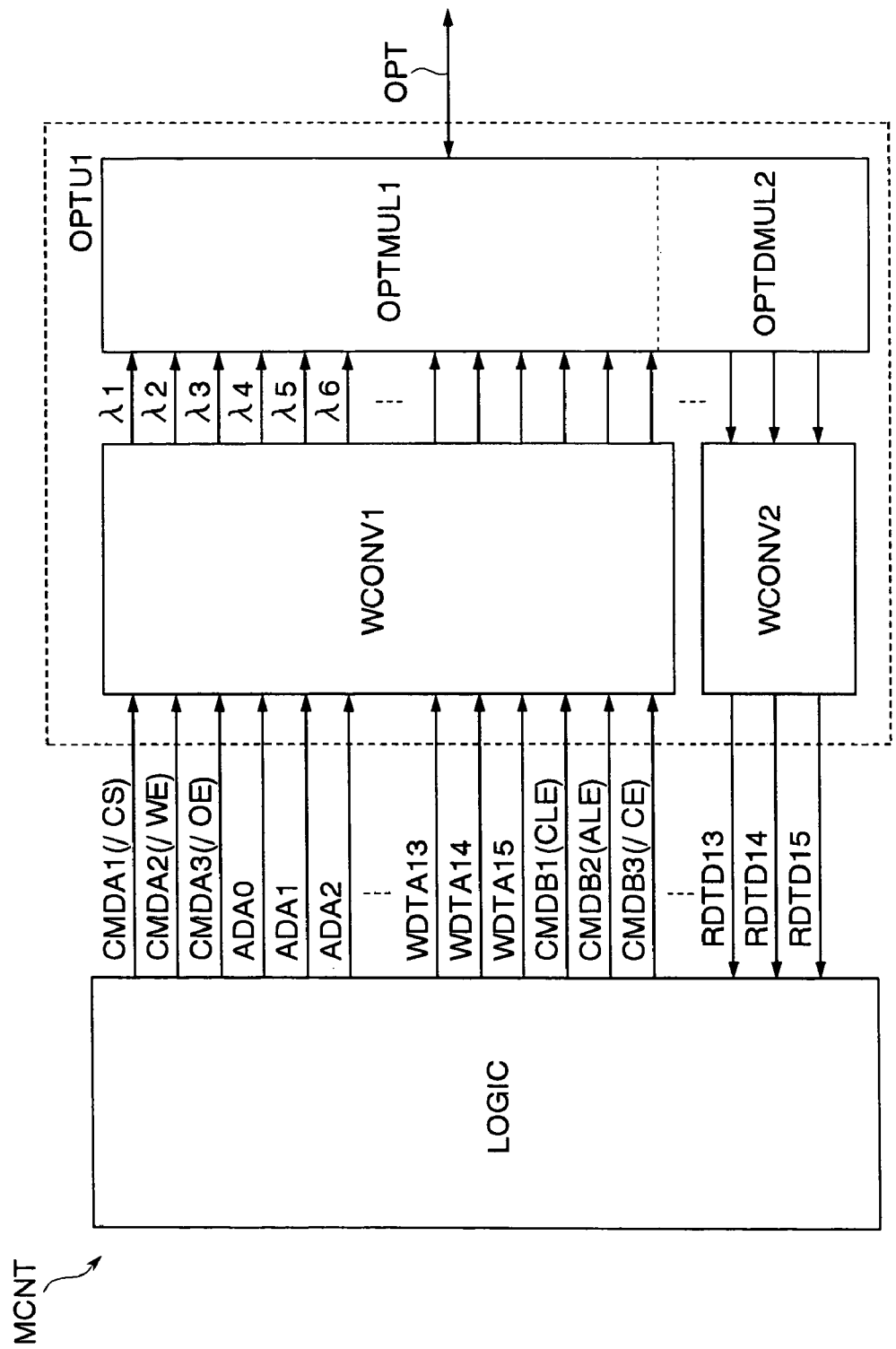
FIG. 13 is a block diagram showing details of a memory controller in the sixth embodiment.

FIG. 13 shows details of a memory controller MCNT in a sixth embodiment of the present invention. The same reference symbols are used to designate the same components as the components described in the first and second embodiments, and detailed description thereof will be omitted.

In this embodiment, a logic circuit LOGIC of the memory controller MCNT is an optical digital circuit to/from which optical signals are transferred. Therefore, the logic circuit LOGIC outputs optical signals to an optical converting unit OPTU1 and receives optical signals from the optical converting unit OPTU1. All the wavelengths of the optical signals transferred in the logic circuit LOGIC are the same irrespective of signals. The other configuration is the same as that of the first embodiment. A memory interface unit MIFU of a memory module MODULE is the same as that in FIG. 3 described above. The system bus SBUS shown in FIG. 1 may be either an electrical interface or an optical interface.

The optical converting unit OPTU1 has: a wavelength converter WCONV1 converting the optical signals from the logic circuit LOGIC into optical signals with predetermined wavelengths (for example, λ1-6) respectively and outputting them to an optical multiplexer OPTMUL1; and a wavelength converter WCONV2 converting wavelengths of optical signals from an optical demultiplexer OPTDMUL2 to the wavelength used in the logic circuit LOGIC. The relation between access signals (command signals CMD, address signals AD, and write data signals WD1) supplied to the optical multiplexers OPTMUL1 and the wavelengths of the optical signals, and the relation between read data signals RDT outputted from the optical demultiplexer OPTDMUL2 and the wavelengths of the optical signals are the same as those in the first embodiment.

The foregoing sixth embodiment can also provide the same effects as those of the first embodiment described above. In addition, in this embodiment, even when the logic circuit LOGIC handles optical signals, a plurality of memory devices MEM can be accessed through one optical cable OPT. As a result, the transfer rate of signals can be improved.

Figure 14:
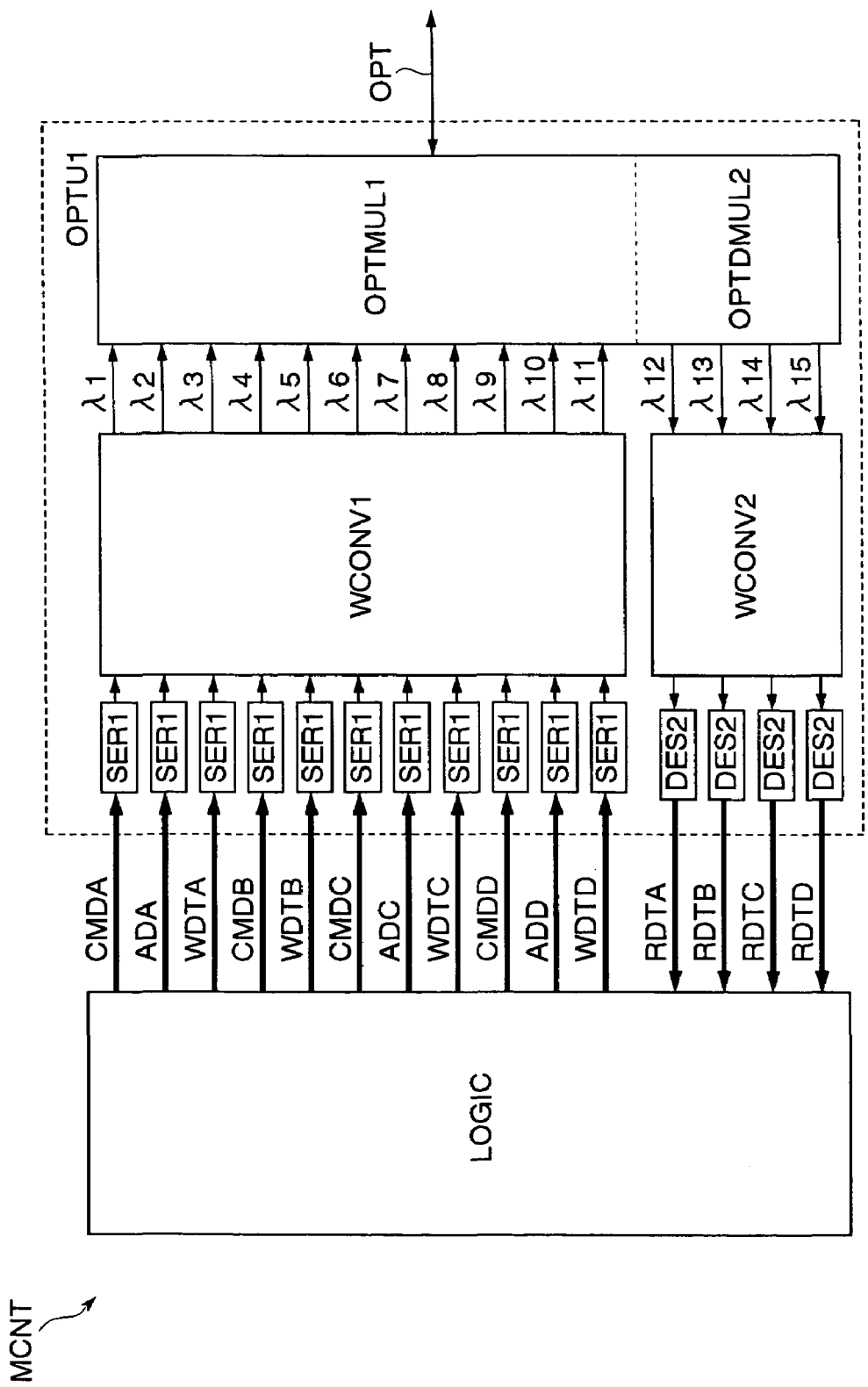
FIG. 14 is a block diagram showing details of a memory controller in the seventh embodiment.

FIG. 14 shows details of a memory controller MCNT in a seventh embodiment of the present invention. The same reference symbols are used to designate the same components as the components described in the first, second, and sixth embodiments, and detailed description thereof will be omitted. In this embodiment, optical serializers OSER1 are connected to inputs of a wavelength converter WCONV1, and optical deserializers ODES2 are connected to outputs of a wavelength converter WCONV2.

That is, in this embodiment, parallel optical signals outputted from a logic circuit LOGIC are converted to serial optical signals by the optical serializers OSER1 to be supplied to the wavelength converter WCONV1. Similarly, serial optical signals outputted from the wavelength converter WCONV2 are converted to parallel optical signals by the optical deserializers ODES2 to be outputted to the logic circuit LOGIC. The other configuration is the same as that of the sixth embodiment.

A memory interface unit MIFU of a memory module MODULE is the same as that in FIG. 5 described above. The system bus SBUS shown in FIG. 1 may be either an electrical interface or an optical interface. The seventh embodiment can also provide the same effects as those of the first, second, and sixth embodiments described above.

Figure 15:
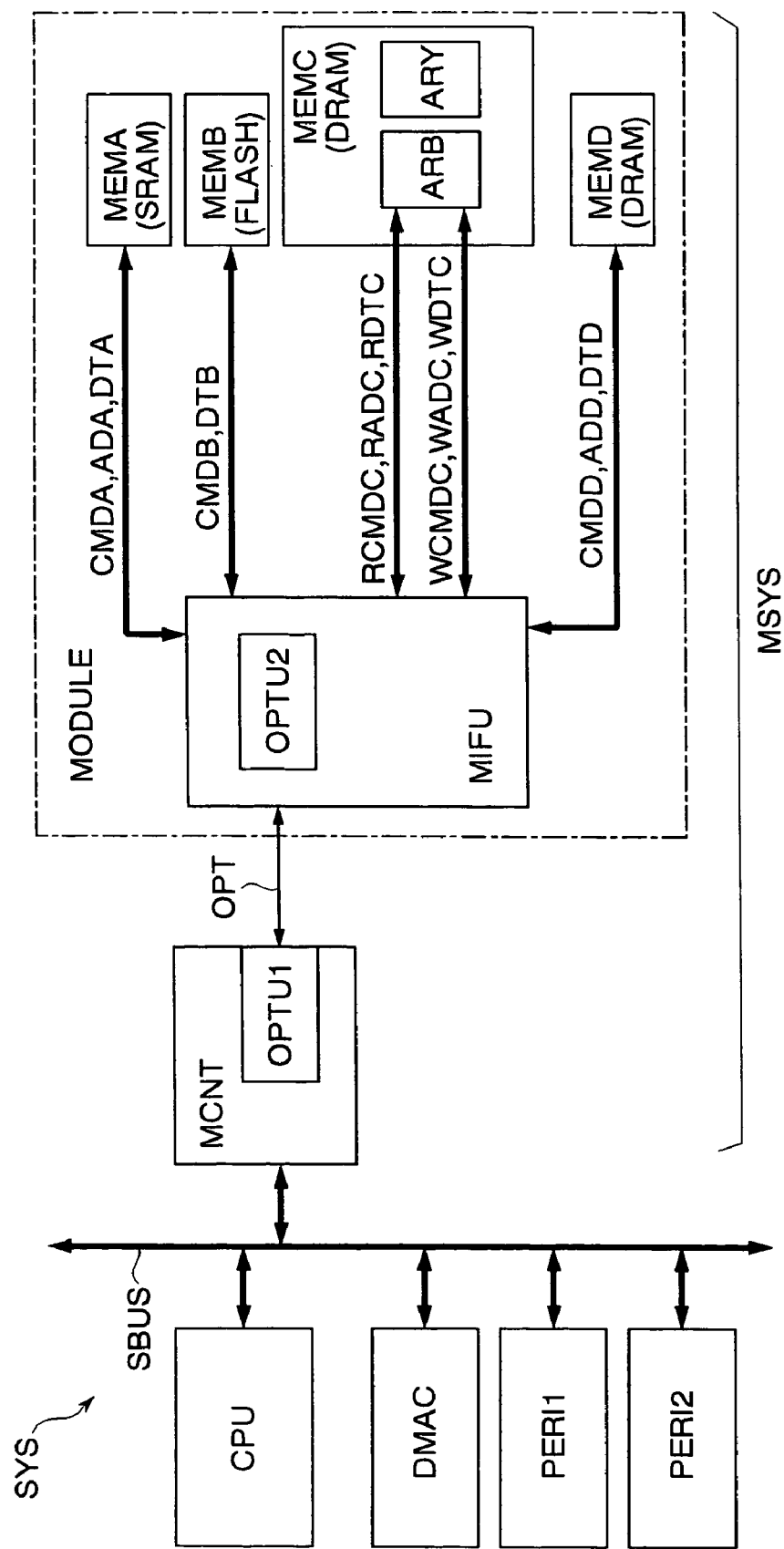
FIG. 15 is a block diagram showing the eighth embodiment.

FIG. 15 shows an eighth embodiment of the present invention. The same reference symbols are used to designate the same components as the components described in the first embodiment, and detailed description thereof will be omitted. In this embodiment, a memory device MEMC (DRAM) receives access signals for read operation (a read command signal RCMDC and a read address signal RADC) and access signals for write operation (a write command signal WCMDC and a write address signal WADC) independently. A read data signal RDTC from the memory device MEMC and a write data signal WDTC to the memory device MEMC are also transmitted/received independently. Signal lines RCMDC, RADC, RDTC and signal lines WCMDC, WADC, WDTC for transferring these signals are laid independently on a memory module MODULE. The memory device MEMC has an arbiter ARB for determining an access priority sequence when the read access signals and the write access signals are received simultaneously. The arbiter ARB accesses a memory cell array ARY in sequence according to the determined priority sequence.

A memory controller MCNT has a function of transmitting/receiving, via an optical cable OPT, the access signals RCMDC, RADC, RDTC and the access signals WCMDC, WADC, WDTC which are independent from each other. A memory interface unit MIFU has a function of transmitting/receiving, via the optical cable OPT, the access signals RCMDC, RADC, RDTC and the access signals WCMDC, WADC, WDTC which are independent from each other. Further, the memory interface unit MIFU has a function of transmitting/receiving the access signals RCMDC, RADC, RDTC and the access signals WCMDC, WADC, WDTC, which are independent from each other, to/from the memory device MEMC. This embodiment is applicable to any of the memory controllers MCNT and the memory interface units MIFU of the first to sixth embodiments.

The foregoing eighth embodiment can also provide the same effects as those of the embodiments described above. In addition, since a read operation and a write operation from/to the memory device MEMC can be executed independently, the transfer rate of signals can be further improved.

Figure 16:
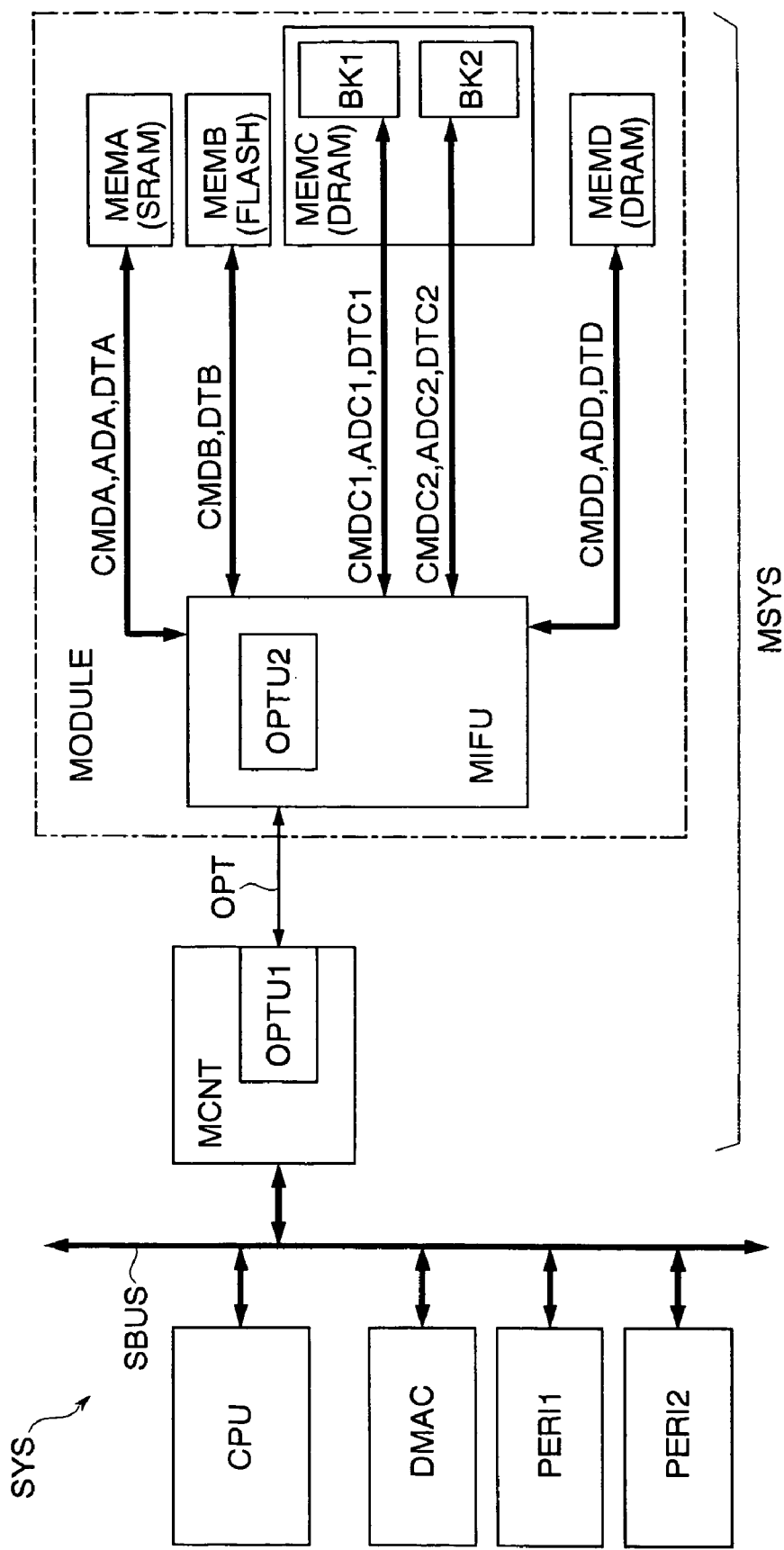
FIG. 16 is a block diagram showing the ninth embodiment.

FIG. 16 shows a ninth embodiment of the present invention. The same reference symbols are used to designate the same components as the components described in the first embodiment, and detailed description thereof will be omitted. In this embodiment, a memory device MEMC (DRAM) has banks BK1, BK2 (memory blocks) operating independently from each other. Further, the memory device MEMC receives access signals for the bank BK1 (a command signal CMDC1 and an address signal ADC1) and access signals for the bank BK2 (a command signal CMDC2 and an address signal ADC2) independently from each other. A data signal DTC1 for the bank BK1 and a data signal DTC2 for the bank BK2 are also transmitted/received independently from each other. Signal lines CMDC1, ADC1, DTC1 and signal lines CMDC2, ADC2, DTC2 for transferring these signals are laid independently on a memory module MODULE.

A memory controller MCNT has a function of transmitting/receiving, via an optical cable OPT, the access signals CMDC1, ADC1, DTC1 and the access signals CMDC2, ADC2, DTC2 which are independent from each other. A memory interface unit MIFU has a function of transmitting/receiving, via the optical cable OPT, the access signals CMDC1, ADC1, DTC1, and the access signals CMDC2, ADC2, DTC2 which are independent from each other. Further, the memory interface unit MIFU has a function of transmitting/receiving the access signals CMDC1, ADC1, DTC1 and the access signals CMDC2, ADC2, DTC2, which are independent from each other, to/from the memory device MEMC. This embodiment is applicable to any of the memory controllers MCNT and the memory interface units MIFU of the first to sixth embodiments.

The foregoing ninth embodiment can also provide the same effects as those of the embodiments described above. In addition, since the banks BK1-2 of the memory device MEMC are independently accessible, the transfer rate of signals can be further improved.

The above third embodiment has described the case where the timing adjustment circuits TADJ1-2 include the deskew circuits DESKW and the window adjusting circuits WND-ADJ. It should be noted that the present invention is not limited to such an embodiment. For example, the timing adjustment circuits TADJ1-2 may be constituted only of the deskew circuits DESKW.

The above eighth embodiment has described the case where the signal lines for the read operation and the signal lines for the write operation of the memory device MEMC are independent from each other. It should be noted that the present invention is not limited to such an embodiment. For example, signals lines for a read operation and signal lines for a write operation in the other memory devices MEMA, MEMB, MEMC may be independent from each other.

The invention is not limited to the above embodiments and various modifications may be made without departing from the spirit and scope of the invention. Any improvement may be made in part or all of the components.

What is claimed is:

1. A memory system comprising:
a plurality of memory devices;
a memory controller multiplexing access signals as an optical signal, the access signals each consisting of a plurality of bits, and outputting the multiplexed optical signal in order to access said memory devices; and
a memory interface unit demultiplexing the multiplexed optical signal received from said memory controller into original optical signals, converting the demultiplexed optical signals into electrical signals, and outputting to said memory devices the electrical signals resulting from the conversion, wherein
said memory controller generates optical signals having different wavelengths according to each of said memory devices and multiplexes the generated optical signals and
said memory interface unit demultiplexes the multiplexed optical signal and determines to which of said memory devices the resulting electrical signals should be outputted according to the wavelengths of the demultiplexed optical signals.

2. The memory system according to claim 1, wherein:
said access signals are electrical signals;
said memory controller has a first electrical/optical converter converting said electrical signals into said optical signals, and a first optical multiplexer multiplexing said optical signals resulting from the conversion by said first electrical/optical converter; and
said memory interface unit has a first optical demultiplexer demultiplexing the optical signal multiplexed by said first optical multiplexer into the original optical signals, and a first optical/electrical converter converting the demultiplexed optical signals into the electrical signals.

3. The memory system according to claim 2, wherein:
said memory interface unit has a second electrical/optical converter converting electrical signals outputted from said memory devices into optical signals with different wavelengths, and a second optical multiplexer multiplexing said optical signals resulting from conversion by said second electrical/optical converter; and
said memory controller has a second optical demultiplexer demultiplexing the optical signal multiplexed by said second optical multiplexer into the original optical signals, and a second optical/electrical converter converting the demultiplexed optical signals into electrical signals.

4. The memory system according to claim 2, wherein:
said memory controller has a first serializer converting parallel access signals into serial signals respectively, and outputting the serial signals resulting from the conversion to said first electrical/optical converter; and
said memory interface unit has a first deserializer with said first optical/electrical converter converting said resulting serial signals into parallel signals.

5. The memory system according to claim 4, wherein:
said memory interface unit has second serializers converting parallel electrical signals outputted from said memory devices into serial signals respectively, a second electrical/optical converter converting the serial signals outputted from said second serializers into optical signals with different wavelengths, and a second optical multiplexer multiplexing said optical signals resulting from the conversion by said second electrical/optical converter; and
said memory controller has a second optical demultiplexer demultiplexing said optical signal multiplexed by said second optical multiplexer into the original optical signals, a second optical/electrical converter converting the demultiplexed optical signals into electrical signals, and a second deserializer converting the serial electrical signals, resulting from the conversion by said second optical/electrical converter, into parallel signals.

6. The memory system according to claim 2, wherein
said memory interface unit has a first timing adjustment circuit adjusting timings of the electrical signals resulting from the conversion by said first optical/electrical converter.

7. The memory system according to claim 6, wherein
said first timing adjustment circuit has a deskew circuit removing skew in electrical signals belonging to a same group.

8. The memory system according to claim 7, wherein
said first timing adjustment circuit has a cycle adjustment circuit synchronizing cycles of the electrical signals from which the skew is removed by said deskew circuit.

9. The memory system according to claim 6, wherein:
said memory interface unit has a second electrical/optical converter converting electrical signals outputted from said memory devices into optical signals with different wavelengths, and a second optical multiplexer multiplexing said optical signals resulting from the conversion by said second electrical/optical converter; and
said memory controller has a second optical demultiplexer demultiplexing the optical signal multiplexed by said second optical multiplexer into the original optical signals, a second optical/electrical converter converting the demultiplexed optical signals into electrical signals, and a second timing adjustment circuit adjusting timings of the electrical signals resulting from the conversion by said second optical/electrical converter.

10. The memory system according to claim 2, wherein
said first electrical/optical converter converts the bits of said access signals into optical signals with different wavelengths.

11. The memory system according to claim 1, wherein:
said access signals are optical signals;
said memory controller has a first wavelength converter converting the wavelengths of said access signals into different wavelengths according to each of the memory devices to be accessed, and a first optical multiplexer multiplexing the optical signals converted by said first wavelength converter; and
said memory interface unit has a first optical demultiplexer demultiplexing the optical signal multiplexed by said first optical multiplexer into the original optical signals, and a first optical/electrical converter converting the demultiplexed optical signals into electrical signals.

12. The memory system according to claim 11, wherein:
said memory interface unit has a second electrical/optical converter converting electrical signals outputted from said memory devices into optical signals with different wavelengths, and a second optical multiplexer multiplexing said optical signals resulting from the conversion by said second electrical/optical converter; and
said memory controller has a second optical demultiplexer demultiplexing the optical signal multiplexed by said second optical multiplexer into the original optical signals and a second wavelength converter converting the demultiplexed optical signals into optical signals with a common wavelength.

13. The memory system according to claim 11, wherein:
said memory controller comprises an optical serializer converting parallel signals, which are constituted of the access signals each consisting of a predetermined number of bits, into a serial signal and outputting the serial signal resulting from the conversion, to said first wavelength converter; and
said memory interface unit comprises an optical deserializer converting the serial optical signal converted by said first wavelength converter, into parallel optical signals.

14. The memory system according to claim 1, wherein
said memory devices are memory devices of different kinds whose command systems differ from one another.

15. The memory system according to claim 1, wherein:
said memory controller outputs to at least one of said memory devices an access signal for a read operation and an access signal for a write operation independently from each other; and
said at least one of the memory devices receives the access signal for the read operation and the access signal for the write operation independently from each other.

16. The memory system according to claim 15, wherein
said memory controller receives, as the access signal to said at least one of the memory devices, a command signal and an address signal for the read operation and a command signal and an address signal for the write operation independently from each other.

17. The memory system according to claim 1, wherein:
at least one of said memory devices has a plurality of memory blocks capable of operating independently;
said memory controller outputs, to the memory device having said memory blocks, independent access signals for each of said memory blocks; and
the memory device having said memory blocks receives said independent access signals for each of said memory blocks.

18. The memory system according to claim 1, further comprising
a memory module including said memory devices and said memory interface unit.

* * * * *